(12) United States Patent
Han et al.

(10) Patent No.: US 8,039,406 B2
(45) Date of Patent: Oct. 18, 2011

(54) METHOD OF GAP-FILLING USING AMPLITUDE MODULATION RADIOFREQUENCY POWER AND APPARATUS FOR THE SAME

(75) Inventors: Jeong Hoon Han, Gyeonggi-do (KR); Jin Hyuk Yoo, Gyeonggi-do (KR); Young Rok Kim, Gyeonggi-do (KR)

(73) Assignee: Jusung Engineering Co., Ltd., Gyeonggi-Do (KR)

( * ) Notice: Subject to any disclaimer, the term of this patent is extended or adjusted under 35 U.S.C. 154(b) by 119 days.

(21) Appl. No.: 12/558,559

(22) Filed: Sep. 13, 2009

(65) Prior Publication Data
US 2010/0031886 A1    Feb. 11, 2010

Related U.S. Application Data

(62) Division of application No. 11/746,566, filed on May 9, 2007, now Pat. No. 7,605,084.

(30) Foreign Application Priority Data

May 10, 2006  (KR) .................. 10-2006-0042031

(51) Int. Cl.
*C23C 16/505* (2006.01)
*H01L 21/42* (2006.01)

(52) U.S. Cl. ................ 438/798; 118/723 E; 156/345.44
(58) Field of Classification Search .................. 438/771
See application file for complete search history.

(56) References Cited

U.S. PATENT DOCUMENTS

| | | | |
|---|---|---|---|
| 4,808,258 A | 2/1989 | Otsubo et al. | |
| 5,562,952 A | 10/1996 | Nakahigashi et al. | |
| 5,614,060 A * | 3/1997 | Hanawa | ....................... 438/720 |
| 5,792,522 A | 8/1998 | Jin et al. | |
| 6,106,737 A | 8/2000 | Tomoyasu et al. | |
| 6,562,190 B1 | 5/2003 | Kuthi et al. | |
| 6,726,804 B2 | 4/2004 | Wang et al. | |
| 7,217,658 B1 | 5/2007 | Bayman et al. | |
| 2008/0023443 A1 * | 1/2008 | Paterson et al. ................. 216/67 |

* cited by examiner

*Primary Examiner* — Stephen W Smoot
(74) *Attorney, Agent, or Firm* — Portland IP Law LLC

(57) ABSTRACT

A method of filling a gap on a substrate comprises disposing the substrate, on which the gap is formed, on a susceptor in a chamber; applying a source power to the chamber to generate plasmas into the chamber; supplying a process gas into the chamber; filling a thin film into a gap by applying a first bias power to the susceptor, an amplitude of the first bias power being periodically modulated; stopping supply of the process gas and cutting off the first bias power; and extinguish the plasmas in the chamber.

17 Claims, 10 Drawing Sheets envelope  modulated waveform m=0.5

50% modulation, m=0.5

METHOD OF GAP-FILLING USING AMPLITUDE MODULATION RADIOFREQUENCY POWER AND APPARATUS FOR THE SAME

CROSS-REFERENCE TO RELATED APPLICATION

This application is a Divisional Application of U.S. application Ser. No. 11/746,566, filed May 9, 2007, issued as U.S. Pat. No. 7,605,084, which claims priority to Korean Patent Application No. 2006-0042031 filed in Korea on May 10, 2006, the contents of which are incorporated herein by reference in their entirety.

BACKGROUND OF THE INVENTION

1. Field of the Invention

The present invention relates to a method of gap-filling used for fabricating a semiconductor device, and more particularly, to a gap-fill method using an amplitude modulation radiofrequency (RF) power and an apparatus for the same.

2. Discussion of the Related Art

There are many trenches and holes (or gaps) to be filled up when forming separating layer between elements, an inter metal dielectric (IMD) layer and an interlayer dielectric (ILD) layer in a fabricating process of a semiconductor device. Recently, since a density of semiconductor device increases and a width of a metal line and a distance between devices decrease, widths of the trenches and gaps decrease. As a result, there is requirement to be improved in a gap-fill process.

There are many methods for gap-filling. Among these gap-filling methods, since high aspect ratio is required, a high density plasma chemical vapor deposition (HDPCVD) method has been widely because of excellent gap-fill characteristics. In the HDPCVD method, the gaps are filled up using high density plasma.

FIG. 1 is a schematic cross-sectional view showing a conventional high density plasma chemical vapor deposition (HDPCVD) apparatus. As shown in FIG. 1, a conventional HDPCVD apparatus 10 includes a chamber 11, a susceptor 12, a gas injector 13, a RF antenna 14, a source RF power supply 15, a bias RF power supply 17 and a direct current (DC) power supply 20. The chamber 11 has an inner reactive space. An insulating plate 21, which isolates an inner space of the chamber 110 from an outer space, is disposed on an upper wall of the chamber 11. The susceptor 12 is disposed in the chamber 11. A substrate "w" is loaded on the susceptor 12. The gas injector 13 is disposed on opposite side walls of the chamber 11 and around the susceptor 12. The gas is injected into the chamber 11 through the gas injector 13. The RF antenna 14 is disposed over the chamber 11 and functions as a plasma injecting source. The RF antenna 14 is connected to the source RF power supply 15. The bias RF power supply 17, which controls an energy density of ion supplied onto the substrate "w", is connected to the susceptor 12. Generally, a power frequency of the source RF power supply 15 may be one of 400 KHz, 2 MHz, 13.56 MHz and more than 27.12 MHz. A power frequency of the bias RF power supply 17 may be one of 13.56 MHz or less than 2 MHz. A source matching circuit 16 and a bias matching circuit 18 are respectively connected to the source RF power supply 15 and the bias RF power supply 17 to matches impedances. In addition, a direct current (DC) electrode 19 is formed in the susceptor 12 to hold the substrate to the susceptor 12 using a static electricity.

The DC electrode 19 is formed of a metallic material such as tungsten (W). The DC electrode 19 is connected to a DC power supply 20.

A gap-filling process in the above-mentioned HDPCVD device 10 is explained.

A substrate "w" is loaded on a susceptor 12, and inert gases are injected into the chamber 11. And then, plasma is supplied into the chamber 11 by applying a source voltage from the source RF power supply 15 to the RF antenna 14. At this time, a reactant gas, such as silane ($SiH_4$) and oxygen ($O_2$), is injected onto the substrate "w" on the susceptor 12, and the bias RF power supply 17 is turned on. The reactant gas, such as silane ($SiH_4$) and oxygen ($O_2$), is changed into ions and active gases by colliding with electrons to depositing and etching a surface of the substrate "w". The ions and electrons are accelerated by the bias RF power supply 17. Generally, since a depositing rate is greater than an etching rate, the reactant gas is deposited on the substrate "w". The active gases contribute to the depositing, while the ions and electrons contribute to the etching.

When a depositing process is performed without an etching process, there are voids in the gap. FIGS. 2A to 2C are cross-sectional views showing a void formed during a gap-filling process according to the related art. As shown in FIG. 2A, a plurality of gaps "T" are formed on the substrate "w". As shown in FIG. 2B, A material is deposited on the substrate "w" and into the plurality of gaps "T", and an inlet of the gap is much narrow than other portions of the gap. As a material is deposited, the inlet of the gap is choked before the inner space of the gap is perfectly filled with the material, thereby forming a void in the inner space of the gap. It may be referred to as an overhang phenomenon. Other portions of the gap except for the void are filled up by the material. To avoid the overhang phenomenon, the material deposited on the substrate "w" is etched by accelerated ions during deposition of the material.

However, since a width of metal line and a distance of devices, which are referred to as a critical dimension, decrease more and more, the above method, in which a material is deposited and etched at the same time to prevent the overhang phenomenon, has it's limits to prevent the void. It is because that a by-product from etching process is deposited again in the gap, not exhausted, as the critical dimension decreases. It makes the inlet of the gap narrowed. Since pressure around the inlet of the gap is higher than that of other portions of the gap due to ions and electrons diffused to the substrate, an etched material can not be exhausted.

As a result, when the critical dimension is less than 100 nm, there are some voids in the gap even if the material on the inlet of the gap is etched.

SUMMARY OF THE INVENTION

Accordingly, the present invention is directed to a method of gap-filling and an apparatus for the same that substantially obviates one or more of the problems due to limitations and disadvantages of the related art.

An object of the present invention is to provide a method of gap-filling being capable of filling a gap without voids and an apparatus for the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of filling a gap on a substrate comprises disposing the substrate, on which the gap is formed, on a susceptor in a chamber; applying a source power to the chamber to generate plasmas into the chamber; supplying a process gas into the chamber; filling a thin film into a gap by applying a first bias power to the susceptor, an amplitude of the first bias power being periodically modulated; stopping supply of the process gas and cutting off the first bias power; and extinguish the plasmas in the chamber.

In another aspect, a method of filling a gap on a substrate disposed on a susceptor comprises forming plasmas over the substrate; supplying a process gas over the substrate; applying a first power to the susceptor to deposit the process gas onto the substrate and fill a thin film into the gap, the first power being modulated to have different amplitudes; stopping supply of the process gas and cutting off the first power; and extinguishing the plasmas.

In another aspect, a method of filling a gap on a substrate, the method including supplying a source power into a chamber to generate plasmas, injecting a process gas into the chamber, and supplying a bias power to a susceptor, on which the substrate is disposed, in the chamber to deposit the process gas onto the substrate and fill the gap comprises executing a first step of increasing acceleration of ion of the process gas diffused onto the substrate; and executing a second step of decreasing acceleration of ion of the process gas diffused onto the substrate, wherein the first step and the second step are periodically repeated.

In another aspect, an apparatus for filling a gap on a substrate comprises a chamber having an inner space; a susceptor, on which the substrate is disposed, in the inner space of the chamber; a gas injector supplying a processing gas into the chamber; a plasma generating unit disposed at an upper side of the chamber; a source RF power supply applying a source power to the plasma generating unit; a bias RF power supply supplying a bias power to the susceptor; and an amplitude modulation unit between the bias RF power supply and the susceptor, wherein the bias power is modulated by the amplitude modulating unit to have different amplitudes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
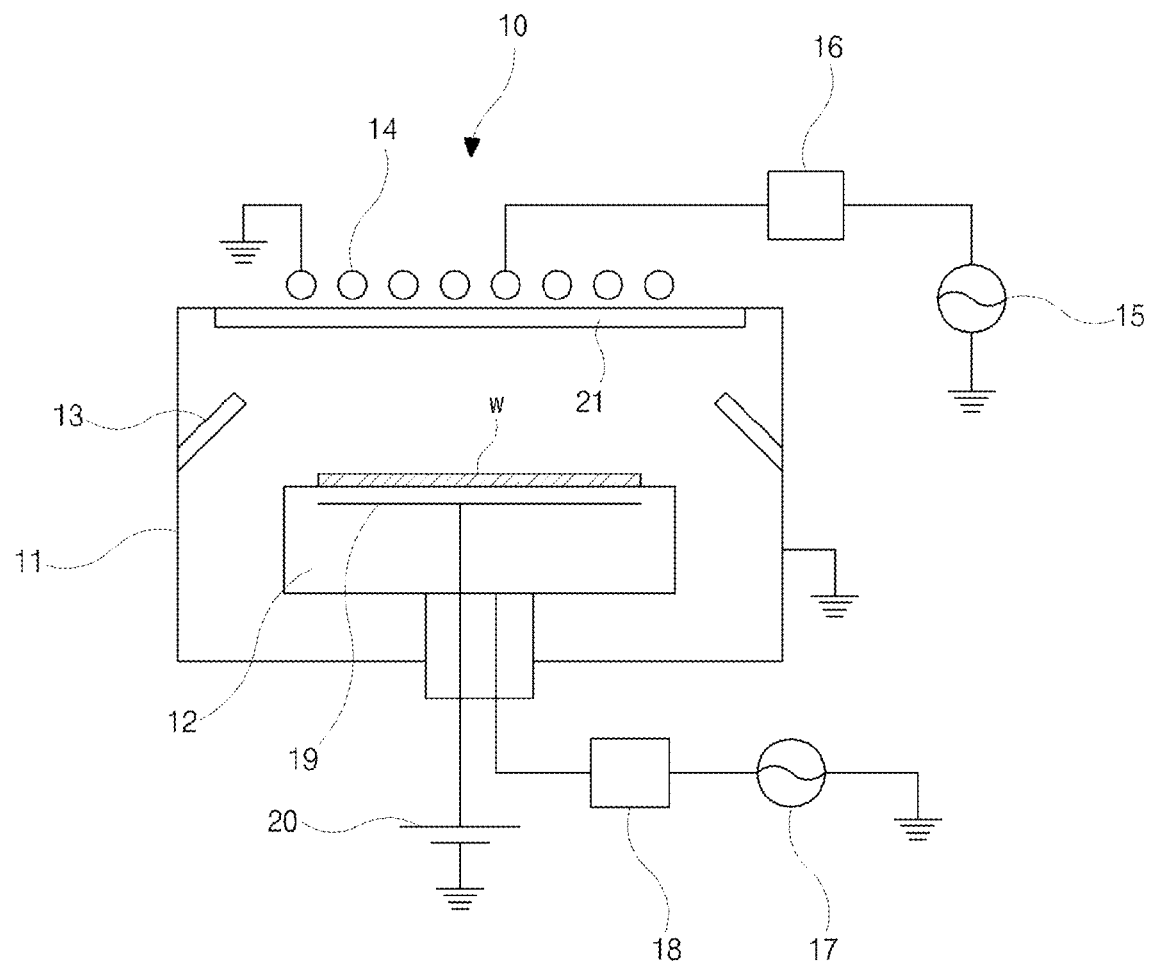
FIG. 1 is a schematic cross-sectional view showing a conventional high density plasma chemical vapor deposition (HDPCVD) apparatus.
Figure 2A:
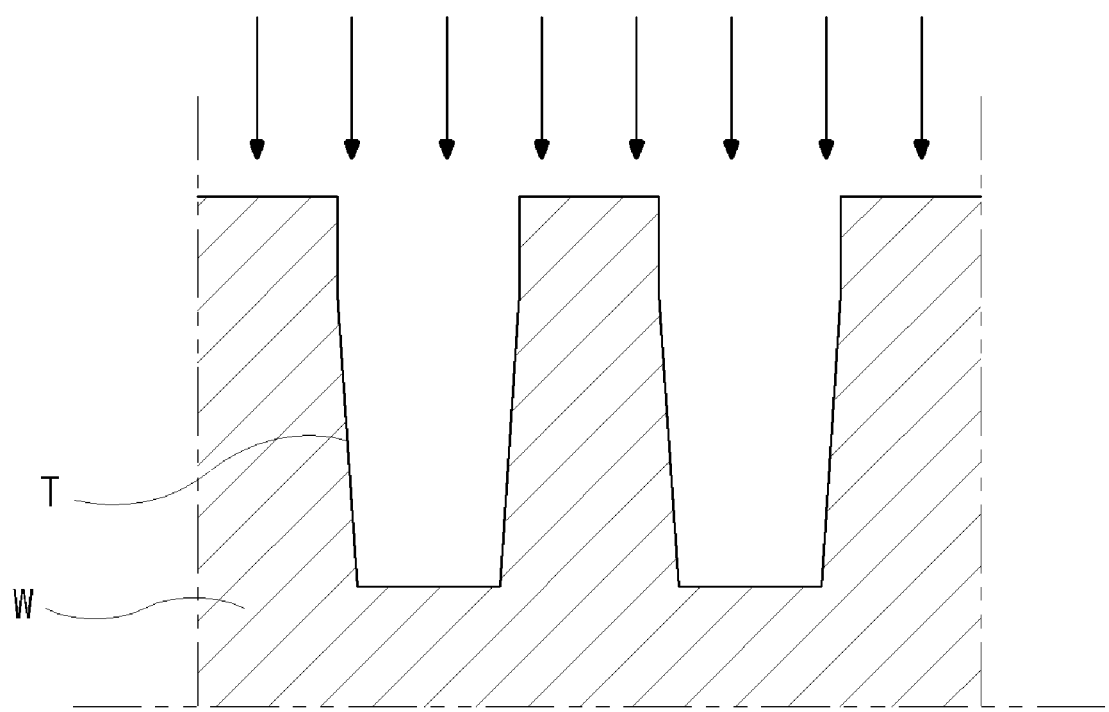
FIGS. 2A to 2C are cross-sectional views showing a void formed during a gap-filling process according to the related art.
Figure 2B:
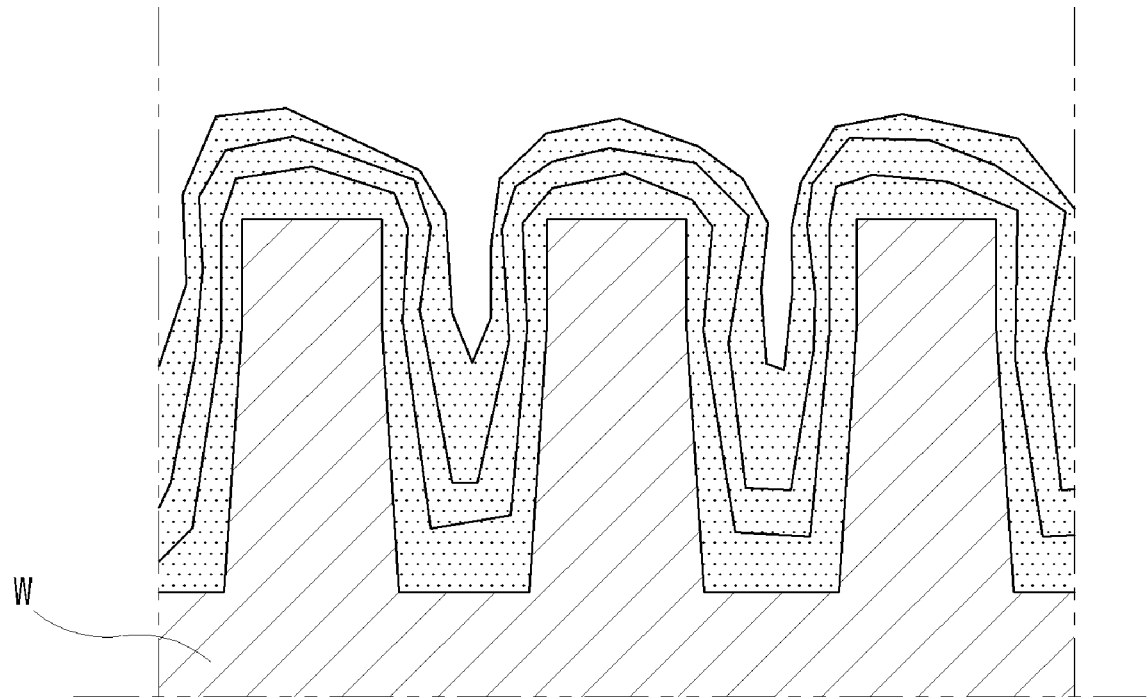
Figure 2C:
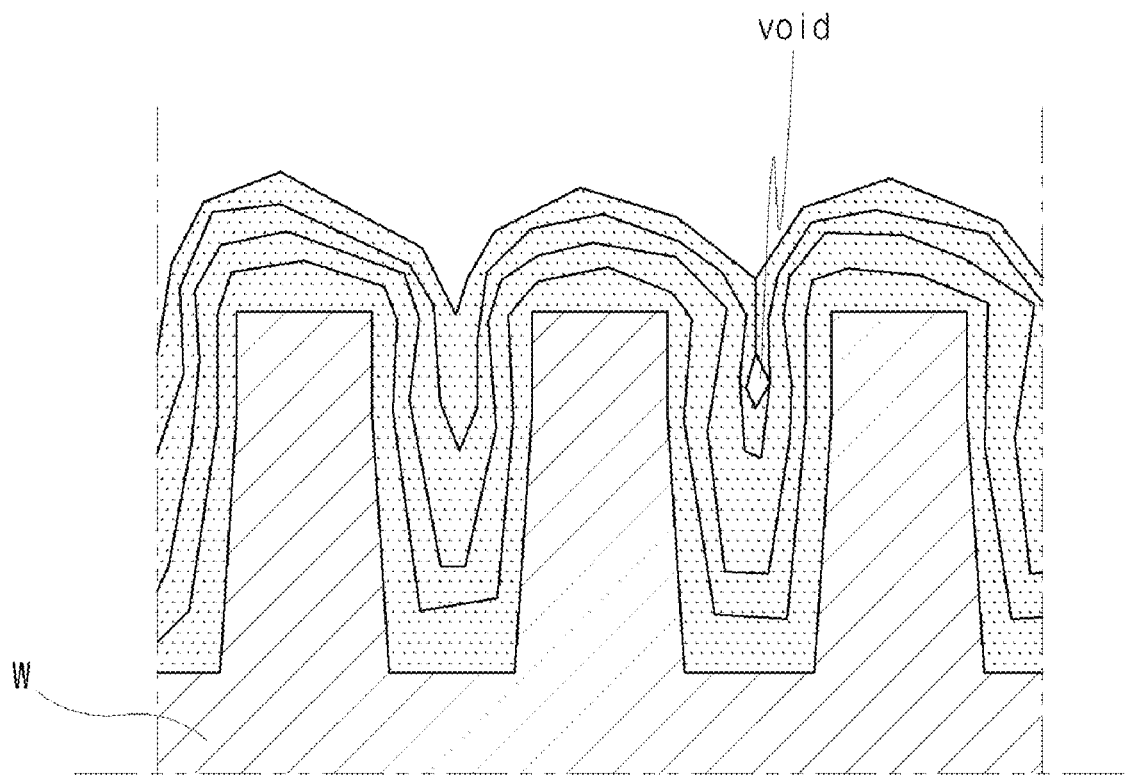
Figure 3:
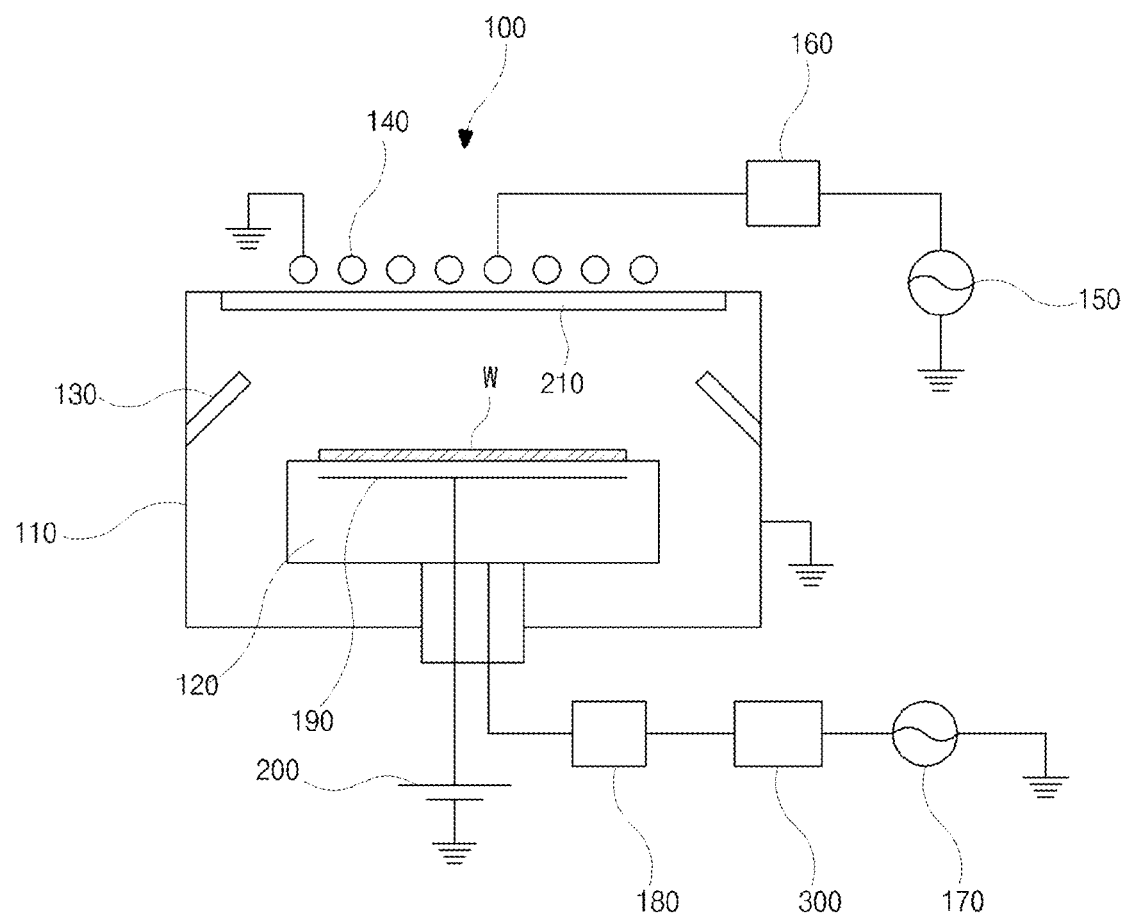
FIG. 3 is a schematic cross-sectional view showing a high density plasma chemical vapor deposition (HDPCVD) apparatus according to a first embodiment of the present invention.

FIG. 3 is a schematic cross-sectional view showing a high density plasma chemical vapor deposition (HDPCVD) apparatus according to a first embodiment of the present invention. As shown in FIG. 3, a HDPCVD apparatus 100 includes a chamber 110, a susceptor 120, a gas injector 130, a radiofrequency (RF) antenna 140, a source RF power supply 150, a bias RF power supply 170, a direct current (DC) power supply 200 and an amplitude modulation unit 300. The chamber 110 has an inner reactive space. An insulating plate 210, which isolates an inner space of the chamber 110 from an outer space, is disposed on an upper wall of the chamber 110. The susceptor 120 is disposed in the chamber 110. A substrate "w" is loaded on the susceptor 120. The gas injector 130 is disposed on opposite side walls of the chamber 110 and around the susceptor 120. The gas is injected into the chamber 110 through the gas injector 130. The RF antenna 140 is disposed over the chamber 110 and functions as a plasma injecting source. The RF antenna 140 is connected to the source RF power supply 150. The bias RF power supply 170, which controls an energy density of ion supplied onto the substrate "w", is connected to the susceptor 120. A source matching circuit 160 and a bias matching circuit 180 are respectively connected to the source RF power supply 150 and the bias RF power supply 170 to matches impedances. In addition, a direct current (DC) electrode 190 is formed in the susceptor 120 to hold the substrate to the susceptor 120 using a static electricity. The DC electrode 190 is formed of a metallic material such as tungsten (W). The DC electrode 190 is connected to a DC power supply 200. The amplitude modulation unit 300 is connected to the bias matching circuit 180 and the bias RF power supply 170. A power from the bias RF power supply 170 is modulated by the amplitude modulation unit 300 to have various amplitudes periodically. Accelerations of the ions diffused onto the substrate "w" are periodically changed depending on the amplitudes of the modulated powers. Namely, as a voltage of the bias RF power supply 170 increases, accelerations of the ions also increase. In other hands, when a voltage of the bias RF power supply 170 decreases, accelerations of the ions also decrease. The accelerations of the ions are proportional to the magnitude of the voltage of the bias RF power supply 170. Moreover, an amount of ions diffused onto the substrate is proportional to the acceleration of the ions. Deposition and etching are more active when an amount of ions diffused onto the substrate "w" increases. Additionally, a by-product is much generated as an etching is more active. With a high acceleration of ion, ions diffused on an inner space of the gap increase and by-products on the inlet of the gap also increase. With a low acceleration of ion, both ions diffused on an inner space of the gap and by-products on the inlet decrease. Accordingly, when acceleration of ions decreases and ions diffused on the substrate "w" decrease, the by-products can be much exhausted to outer space of the gap. Since by-products are actively exhausted and are not deposited again on the substrate "w", a deposition rate on the inlet portion of the gap decreases such that there are increased time to fill up the inner space of the gap. As a result, a void is not generated in the gap. Namely, the overhang phenomenon can be solved and there is no void in the gap with a low acceleration of ion.

Figure 4:
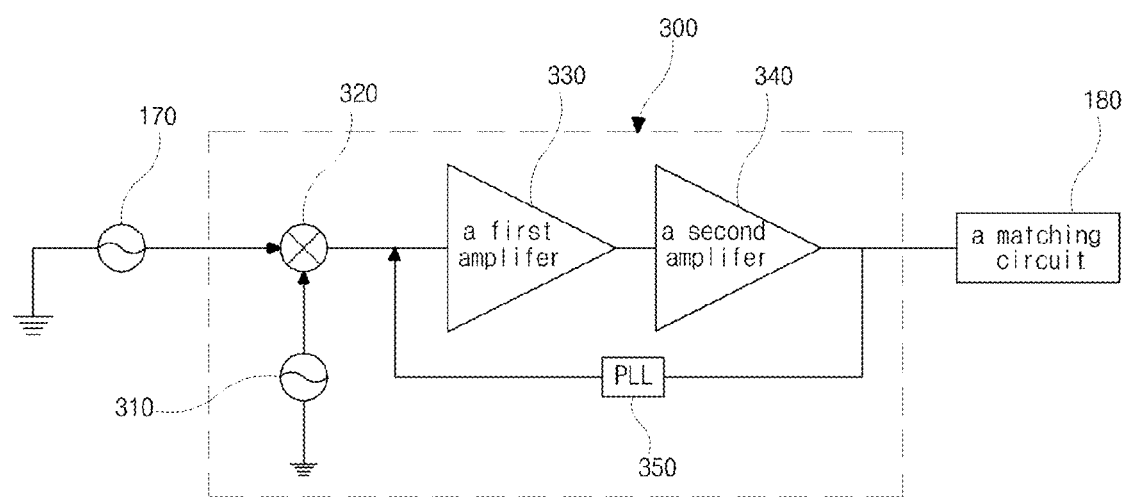
FIG. 4 is a schematic view showing an amplitude modulation unit in the present invention.

FIG. 4 shows an amplitude modulation unit of an apparatus for gap-filling according to the present invention. As shown in FIG. 4, the amplitude modulation unit 300 is connected to both a bias RF power supply 170 and the bias matching circuit 180. The amplitude modulation unit 300 includes a local oscillator 310, a power mixer 320, a first amplifier 330, a second amplifier 340 and a phase lock loop (PLL) 350. The local oscillator 310 generates a power having a frequency different from that of the bias RF power supply 170. The power from the local oscillator 310 has a frequency less than that of RF power supply 170. The power mixer 320 receives and mixes powers from the bias RF power supply 170 and the local oscillator 310. The first amplifier is connected to the power mixer 320 and receives the mixed power.

Assumes that a power function of the bias RF power supply 170 is "$\cos(\omega_c)t$", a power function of the local oscillator 310 is "$1+\cos(\omega_m)t$". In this case, a power function of the power mixer 320 is given by:

$$(1+\cos(\omega_m)t)\cos(\omega_c)t$$

Wherein "$\omega_c$" and "$\omega_m$" are angular frequencies of powers from the bias RF power supply 170 and the local oscillator 310, respectively. And "m" is a modulation index.

Figure 5:
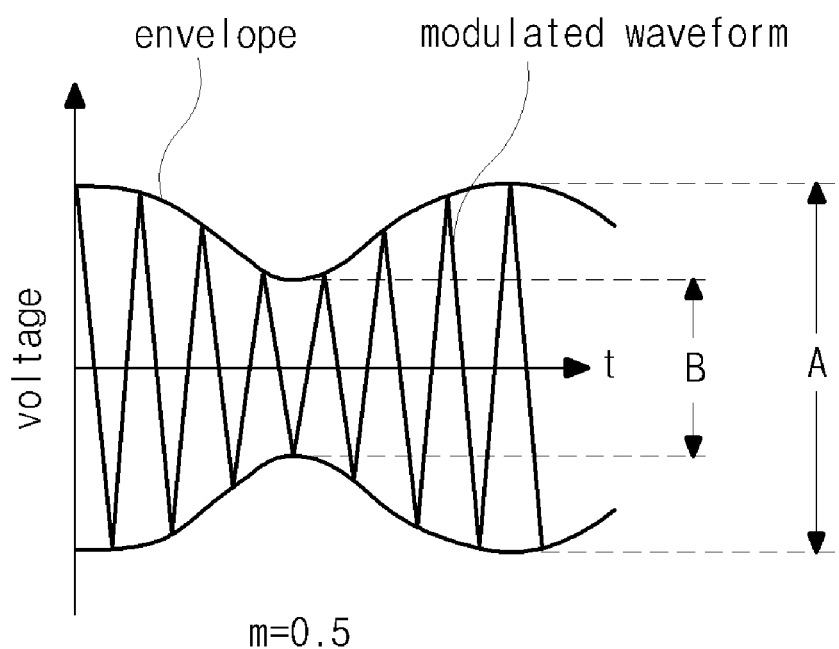
FIG. 5 shows a waveform of an modulated power generating by an amplitude modulating unit.

The power of the power mixer 320 has a waveform shown in FIG. 5. The waveform in FIG. 5 has an envelop with a maximum amplitude "A" and a minimum amplitude "B". In this case, the modulation index "m" is given by:

$$m=(A-B)/(A+B)$$

Since the power function of the power mixer 320 is rewritten by:

$$(1+\cos(\omega_m)t)\cos(\omega_c)t=\cos(\omega_c)t+(m/2)\cos(\omega_c+\omega_m)t+(m/2)\cos(\omega_c-\omega_m)t$$

Accordingly, the power function of the power mixer 320 includes various frequencies, such as "$\omega_c$", "$(\omega_c+\omega_m)$" and "$(\omega_c-\omega_m)$".

The bias RF power supply 170 has a frequency with a range between 100 KHz and 30 MHz. In more particular, the bias RF power supply 170 has a frequency of one of 2 MHz, 13.56 MHz and 27.12 MHz. The local oscillator 310 has a frequency with a range between 10 Hz and 2 MHz. The bias RF power supply 170 and the local oscillator 310 have frequencies with a relation by:

$$\omega_c \geq 10\omega_m$$

On the other hand, a magnitude of the source RF power supply 150 is various depending on a size of the substrate "w". However, a power of the source RF power supply 150 having a value less than 20 W/cm² is applied. If possible, the power of the source RF power supply 150 having a value greater than 20 W/cm² may be applied depending on requirement.

FIG. 5 is a graph plotting time versus voltage of power from a power mixer when the modulation index "m" is 0.5. An amplitude of power from the bias RF power supply 170 is modulated by the power mixer 320 to be various depending on time. The power from the power mixer 320 has three frequencies of "$\omega_c$", "$(\omega_c+\omega_m)$" and "$(\omega_c-\omega_m)$", and has a maximum power at a range of the angular frequency "$\omega_c$" of the bias RF power supply 170.

Since the modulation index "m" is given by:

$$m=(A-B)/(A+B),$$

a waveform of the power is various depending on a value of the modulation index "m". For example, if the modulation index "m" has a value of 1, the minimum amplitude "B" of the envelope becomes zero such that the power is not transferred. And if the modulation index "m" has a value of 0.5, the maximum amplitude "A" of the envelope is three times as much as the minimum amplitude "B" of the envelope. (A=3B)

Figure 6A:
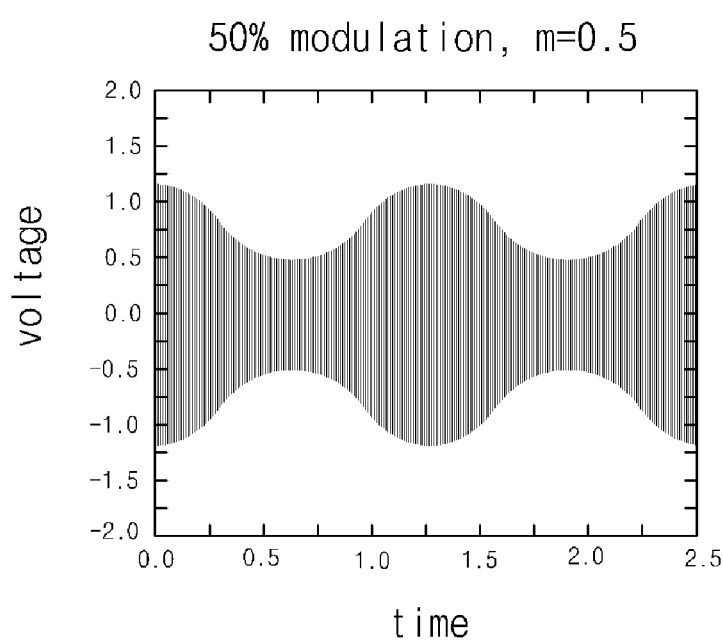
FIGS. 6A and 6B show waveforms when a modulation index has a value of 0.5 and 1, respectively.
Figure 6B:
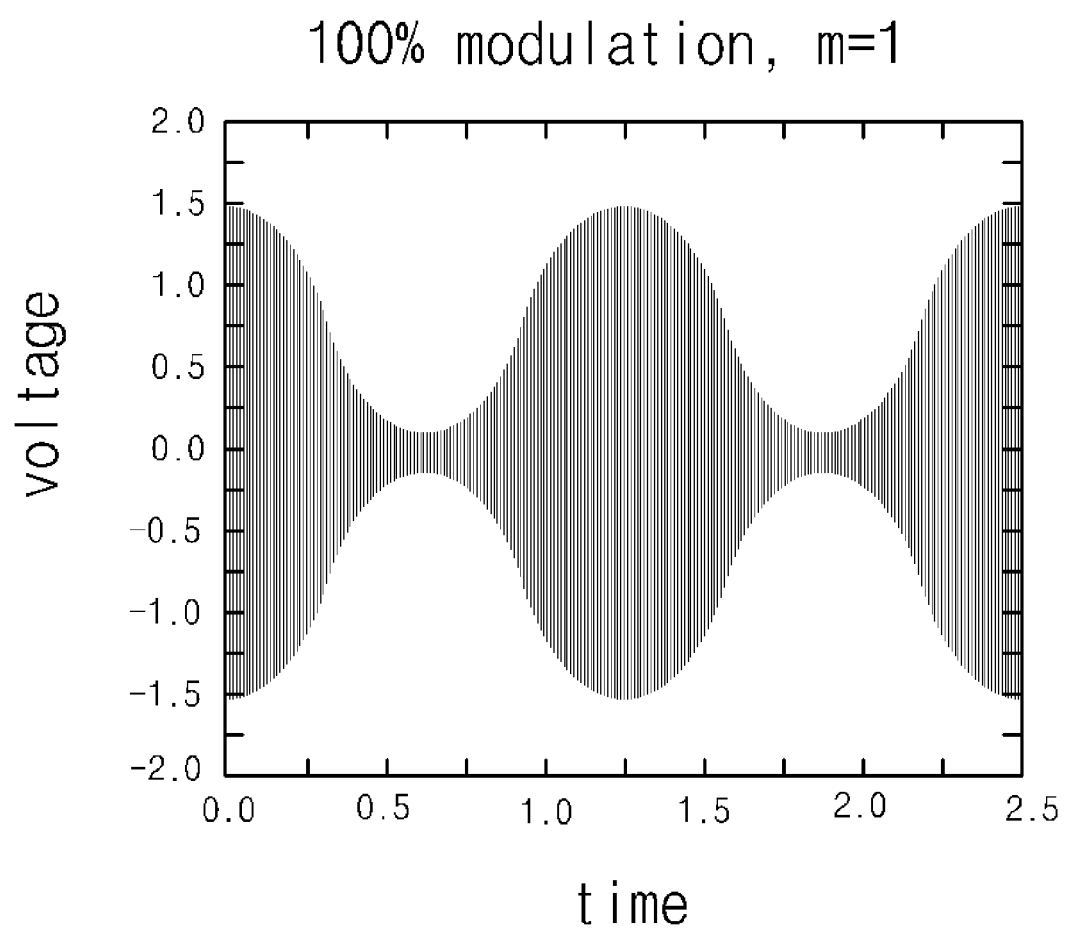

FIGS. 6A and 6B show waveforms when a modulation index has a value of 0.5 and 1, respectively. When the modulation index "m" has a relative low value, there are fluctuations of amplitude in the powers. However, there is no disconnection in the power. On the other hand, when the modulation index "m" has a relative high value, the minimum amplitude "B" (of FIG. 5) becomes a substantially zero such that the power is not transferred. Namely, when the modulation index "m" has a relative high value, there are much fluctuations of amplitude in the powers. Accordingly, in the present invention, the modulation index "m" has a value greater than 0.5 to have much fluctuations of the amplitude and much variance in acceleration of the ions.

Figure 7:
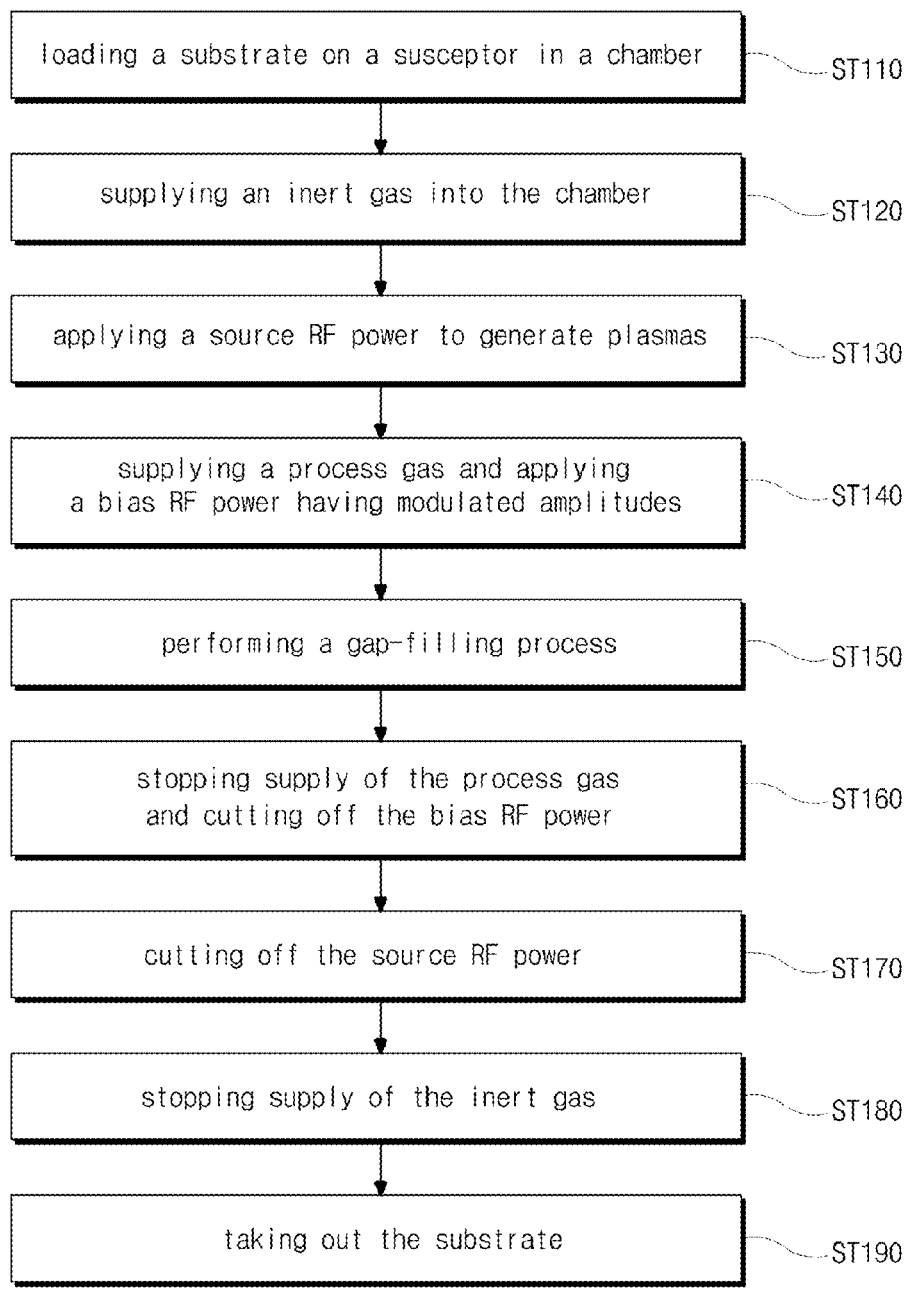
FIG. 7 is a flow chart showing a method of gap-filling.

Hereinafter, a method of gap-filling in a high density plasma chemical vapor disposition (HDPCVD) device according to the present invention with reference to FIGS. 3 and 7. FIG. 7 is a flow chart showing a method of gap-filling.

First, in a first step "ST110", a substrate "w", on which a plurality of gap is formed, is loaded on a susceptor 120 in a chamber 110. Next, in a second step "ST120", an inert gas, such as argon (Ar), helium (He) and hydrogen (H2), is inject into the chamber 110 to stabilize the inner space of the chamber 110. Next, in a third step "ST130", when the inner space of the chamber 110 is maintained to be constant, a source RF power supply 150 is turned on to generate plasma into the inner space of the chamber 110. A current of the source RF power supply 150 has a value with a range between hundreds KHz and dozens MHz. The current of the source RF power supply 150 may have a value one of 13.56 MHz and 27.12 MHz. A power of the source RF power supply 150 is various depending on process conditions. The power of the source RF power supply 150 may have a value less than 20 W/cm2.

Next, in a fourth step "ST140", when plasma is stabilized, process gases are injected into the chamber 110 through the gas injector 130, and the bias RF power supply 170 is turned on to apply a power having modulated amplitudes into the susceptor 120. A kind of the process gases are various depending on what being deposited onto the substrate "w". For example, when a silicon oxide layer is deposited onto the substrate "w", a gas including silicon (Si), e.g., silane ($SiH_4$) gas, oxygen ($O_2$) gas and ozone ($O_3$) gas are used for the process gases. During the process gases being injected, the inert gas may be injected or not. Moreover, during the process gases being injected, pressure in the inner space of the chamber 110 may be maintained in pressure less than several mTorr. The inner space of the chamber 110 may have pressure less than 1 mTorr depending requirement. As mentioned above, to modulate amplitude of powers from the bias RF power supply 170, a local oscillator 310 of the amplitude modulation unit 300 generates a power having a frequency with a range between 10 Hz and 2 MHz. In this case, an angular frequency "$\omega_c$" of the bias RF power supply 170 and an angular frequency "$\omega_m$" of the local oscillator 310 has a relation give by:

$$\omega_c \geq 10\omega_m$$

In the fourth step "ST140", when a power from the bias RF power supply 170 is applied into the susceptor 120, a rear side of the substrate "w" is cooled by using helium gas depending on process temperature.

Next, in a fifth step "ST150", a gap-filling process is performed to fill a thin film into the gap without voids. Namely, silane gas and oxygen gas are activated to be ions and activating gases and are deposited onto and etches surface of the substrate "w" at the same time. In the present invention, since a power of the bias RF power supply 170 is modulated by the amplitude modulation unit 300 and then applied into the susceptor 120, accelerations of ions are fluctuated depending on amplitudes of the power. Accordingly, when the amplitude is high, amount of ions diffused onto the substrate "w" increases such that the depositing and etching are activated. On the other hand, when the amplitude is low, amount of ions diffused onto the substrate "w" decreases such that a depositing rate at a inlet portion of a gap decreases. It is because by-products are easily exhausted into an outer space of the gap, as mentioned above. Accordingly, the gap can be filled up by a material without a void.

Next, in sixth and seventh steps "ST160" and "ST170", after finishing the gap-filling process, supply of the process gases is interrupted, the bias RF power supply 170 and the source RF power supply 150 are turned off. As a result, plasma disappears. Depending on requirement, the inert gas may be continuously supplied.

If the inert gas is continuously supplied, supply of the inert gas is interrupted in an eighth step "ST180". And then, in a ninth step "ST190", the substrate "w" is carried out.

On the other hand, in the fourth step "ST140", it is not required that the power having modulated amplitudes are applied during a whole process time. The power having modulated amplitudes may be applied during a initial process time, and a power without amplitude modulating may be applied during later process time. Namely, the depositing process includes a step of modulating the power and a step of non-modulating the power. When the step of modulating the power is changed into the step of non-modulating the power, a modulating index becomes smaller stepwise. The smaller the modulating index becomes, the smaller difference between a maximum amplitude of a modulated power from the power mixer and a minimum amplitude of the modulated power from the power mixer becomes.

On the other hand, the depositing process divided into three steps of an initial non-modulating step, a modulating step and a later non-modulating step.

In an initial stage of the depositing process, since the gap is filled up without voids and the aspect ratio becomes large, a power is not required to be modulated. When the gap is partially filled up, then, the modulating step is performed. And after the gap is filled up, the later non-modulating step is performed. Period of the initial non-modulating step is determined depending on a shape of the gap. When the initial non-modulating step is changed into the modulating step, a modulation index becomes larger stepwise. The larger the modulation index becomes, the larger difference between a maximum amplitude of a modulated power from the power mixer and a minimum amplitude of the modulated power from the power mixer becomes. And when the modulating step is changed into the later non-modulating step, a modulating index becomes smaller stepwise.

Figure 8:
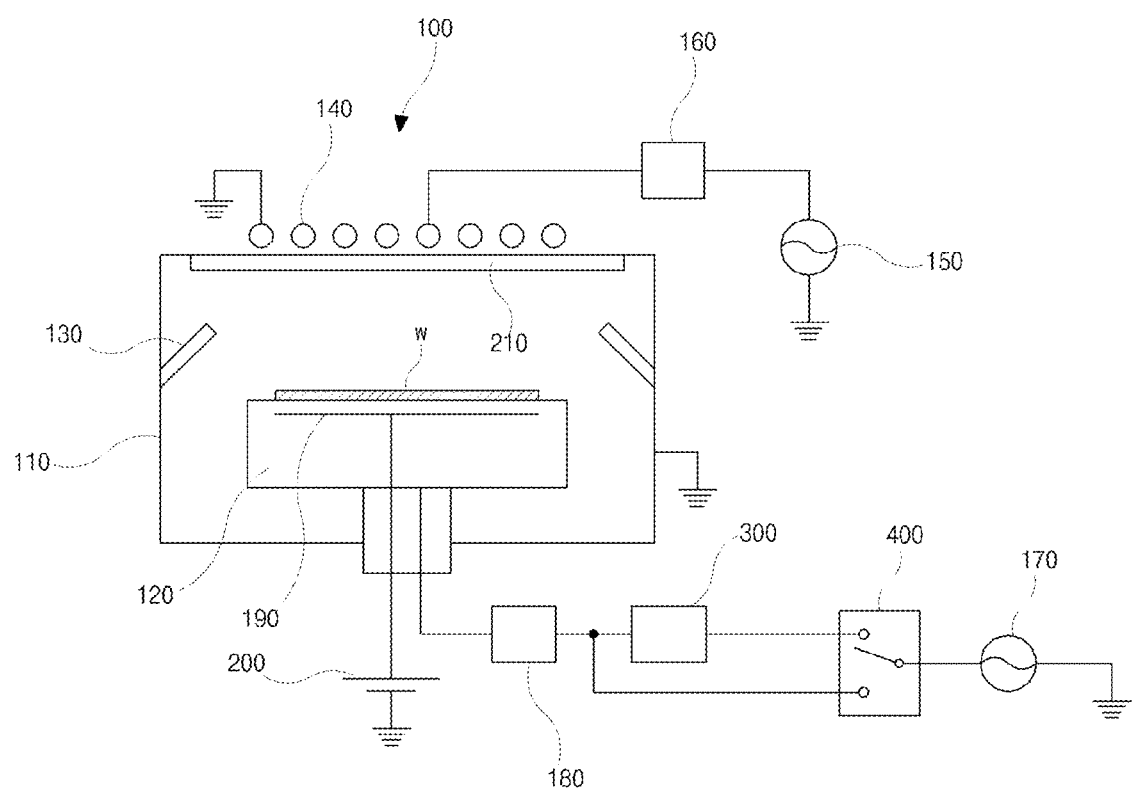
FIG. 8 is a schematic cross-sectional view showing a high density plasma chemical vapor deposition (HDPCVD) apparatus according to a second embodiment of the present invention.

To obtain the above-mentioned process, a bias RF power supply 170 is connected to an amplitude modulation unit 300 via a switching unit 400, as shown in FIG. 8. FIG. 8 is a schematic cross-sectional view showing a high density plasma chemical vapor deposition (HDPCVD) apparatus according to a second embodiment of the present invention.

When the switching unit 400 is turned on, the bias RF power 170 is connected to the amplitude modulation unit 300 such that a power from the bias RF power 170 is modulated by the amplitude modulation unit 300. However, when the switching unit 400 is turned off, the bias RF power 170 is disconnected to the bias matching circuit 180 such that a power from the bias RF power 170 is not modulated by the amplitude modulation unit 300. When the switching unit 400 is turned off, the bias RF power 170 is directly connected to a bias matching circuit 180.

It will be apparent to those skilled in the art that various modifications and variations can be made in the apparatus having a high gas conductance without departing from the spirit or scope of the invention. Thus, it is intended that the present invention covers the modifications and variations of this invention provided they come within the scope of the appended claims and their equivalents.

What is claimed is:

1. An apparatus for filling a gap on a substrate, comprising:
   a chamber having an inner space;
   a susceptor, on which the substrate capable of being disposed, in the inner space of the chamber;
   a gas injector for supplying a processing gas into the chamber;
   a plasma generating unit disposed at an upper side of the chamber;
   a source RF power supply for applying a source power to the plasma generating unit;
   a bias RF power supply for supplying a bias power to the susceptor; and
   an amplitude modulation unit between the bias RF power supply and the susceptor,
   wherein the bias power capable of being modulated by the amplitude modulating unit to have different amplitudes.

2. The apparatus according to claim 1, further comprising a switching unit between the amplitude modulating unit and the bias RF power supply, wherein the bias power is modulated by the amplitude modulation unit when the switching unit is turned on, and the bias power is not modulated when the switching unit is turned off.

3. The apparatus according to claim 1, wherein the amplitude modulation unit includes;
   a local oscillator for generating a local power having a different frequency from a frequency of the bias power; and
   a power mixer for mixing the local power and the bias power to modulate the bias power.

4. The apparatus according to claim 3, wherein the bias power has a frequency with a range of 100 KHz to 30 MHz, and the local power has a frequency with a range of 10 Hz to 2 MHz.

5. The apparatus according to claim 3, wherein $$\omega_c \geq 10\omega_m,$$

wherein $\omega_c$ is an angular frequency of the bias power, and $\omega_m$ is an angular frequency of the local power.

6. The apparatus according to claim 3, wherein $$m=(A-B)/(A+B)=0.5,$$

wherein m is a modulation index of the modulated bias power, A is a maximum amplitude of the modulated bias power, and B is a minimum amplitude of the modulated bias power.

7. The apparatus according to claim 3, wherein the amplitude modulation unit further includes:

a first amplifier connected to the power mixer; and a second amplifier connected to the first amplifier.

8. The apparatus according to claim 7, wherein the amplitude modulation unit further includes a phase lock loop connected to an input stage of the first amplifier and an output stage of the second amplifier.

9. The apparatus according to claim 8, wherein the first amplifier is configured to receive the mixed power.

10. The apparatus according to claim 1, further comprising a bias matching circuit connected to the bias RF power supply to match impedance.

11. The apparatus according to claim 1, wherein the plasma generating unit includes:

an RF antenna disposed over the chamber and connected to the source RF power supply; and a source matching circuit connected to the RF antenna and the source RF power supply.

12. The apparatus according to claim 11, further comprising an insulating plate for isolating an inner space of the chamber from an outer space, wherein the RF antenna is disposed over the insulating plate.

13. The apparatus according to claim 11, wherein the RF antenna functions as a plasma injecting source.

14. The apparatus according to claim 1, further comprising a direct current electrode formed in the susceptor to hold the substrate to the susceptor using a static electricity.

15. The apparatus according to claim 1, wherein the bias power has a frequency of one of 2 MHz, 13.56 MHz and 27.12 MHz.

16. The apparatus according to claim 1, wherein a magnitude of the source RF power supply is dependent on a size of the substrate.

17. The apparatus according to claim 1, wherein a power of the source RF power supply has a value less than 20 W/cm$^2$.

* * * * *